US008638550B2

(12) United States Patent  (10) Patent No.: US 8,638,550 B2
Xia  (45) Date of Patent: Jan. 28, 2014

(54) KEYED MEDIA DRIVE RAILS

(75) Inventor: Xiaosong Xia, Beijing (CN)

(73) Assignee: Lenovo (Singapore) Pte. Ltd., Singapore (SG)

( * ) Notice: Subject to any disclaimer, the term of this patent is extended or adjusted under 35 U.S.C. 154(b) by 420 days.

(21) Appl. No.: 13/049,115

(22) Filed: Mar. 16, 2011

(65) Prior Publication Data

US 2012/0236490 A1  Sep. 20, 2012

(51) Int. Cl.
*H05K 7/00* (2006.01)
(52) U.S. Cl.
USPC ................................ 361/679.37; 361/679.33
(58) Field of Classification Search
USPC .............. 361/679.33, 679.37–679.39; 211/26
See application file for complete search history.

(56) References Cited

U.S. PATENT DOCUMENTS

| 6,288,902 | B1 | 9/2001 | Kim et al. |
|---|---|---|---|
| 6,754,074 | B2 | 6/2004 | McClelland et al. |
| 6,970,352 | B2 | 11/2005 | Record et al. |
| 7,542,295 | B2 | 6/2009 | Imsand |
| 7,864,522 | B1 | 1/2011 | Peng et al. |
| 8,045,326 | B1 | 10/2011 | Reznikov |
| 8,300,398 | B2 | 10/2012 | Zhang et al. |
| 2002/0199048 | A1 | 12/2002 | Rabinovitz |
| 2009/0273906 | A1 | 11/2009 | Bohnen et al. |
| 2010/0172087 | A1* | 7/2010 | Jeffery et al. ............ 361/679.33 |
| 2011/0058328 | A1 | 3/2011 | Ajo et al. |
| 2011/0101831 | A1 | 5/2011 | Wang et al. |

* cited by examiner

*Primary Examiner* — Ramon Barrera
(74) *Attorney, Agent, or Firm* — Brian J. Pangrle

(57) ABSTRACT

A media drive tray can include a front plate; a first rail extending from and perpendicular to the front plate where the first rail includes features for securing the first rail to a media drive and a first rail height; and a second rail extending from and perpendicular to the front plate, parallel to the first rail, where the second rail includes features for securing the second rail to a media drive and a second rail height that differs from the first rail height. Various other apparatuses, systems, methods, etc., are also disclosed.

20 Claims, 8 Drawing Sheets

KEYED MEDIA DRIVE RAILS

TECHNICAL FIELD

Subject matter disclosed herein generally relates to technology for a media drive assemblies and bays, for example, of a server unit.

COPYRIGHT NOTICE

A portion of the disclosure of this patent document contains material to which a claim for copyright is made. The copyright owner has no objection to the facsimile reproduction by anyone of the patent document or the patent disclosure, as it appears in the Patent and Trademark Office patent file or records, but reserves all other copyright rights whatsoever.

BACKGROUND

Conventional server units include bays for installation of media drives such as hard disk drives (HDDs) where each drive is typically carried in its own tray. Trays often include guides such as rails that fit into slots of a bay. Sometimes, slots are symmetrical, which allows for installation of a tray assembly in more than one orientation. Multiple orientations can cause confusion when trying to locate and replace a media drive seated in a server unit, especially where the unit is in a server rack or server tower that includes multiple units. As described herein, various keyed components ensure that media drives are seated in a relatively uniform manner in a server unit and optionally further ensure that only certified media drive assemblies are used.

SUMMARY

A media drive tray can include a front plate; a first rail extending from and perpendicular to the front plate where the first rail includes features for securing the first rail to a media drive and a first rail height; and a second rail extending from and perpendicular to the front plate, parallel to the first rail, where the second rail includes features for securing the second rail to a media drive and a second rail height that differs from the first rail height. Various other apparatuses, systems, methods, etc., are also disclosed.

BRIEF DESCRIPTION OF THE DRAWINGS

Features and advantages of the described implementations can be more readily understood by reference to the following description taken in conjunction with examples of the accompanying drawings.

DETAILED DESCRIPTION

The following description includes the best mode presently contemplated for practicing the described implementations. This description is not to be taken in a limiting sense, but rather is made merely for the purpose of describing the general principles of the implementations. The scope of the invention should be ascertained with reference to the issued claims.

Figure 1:
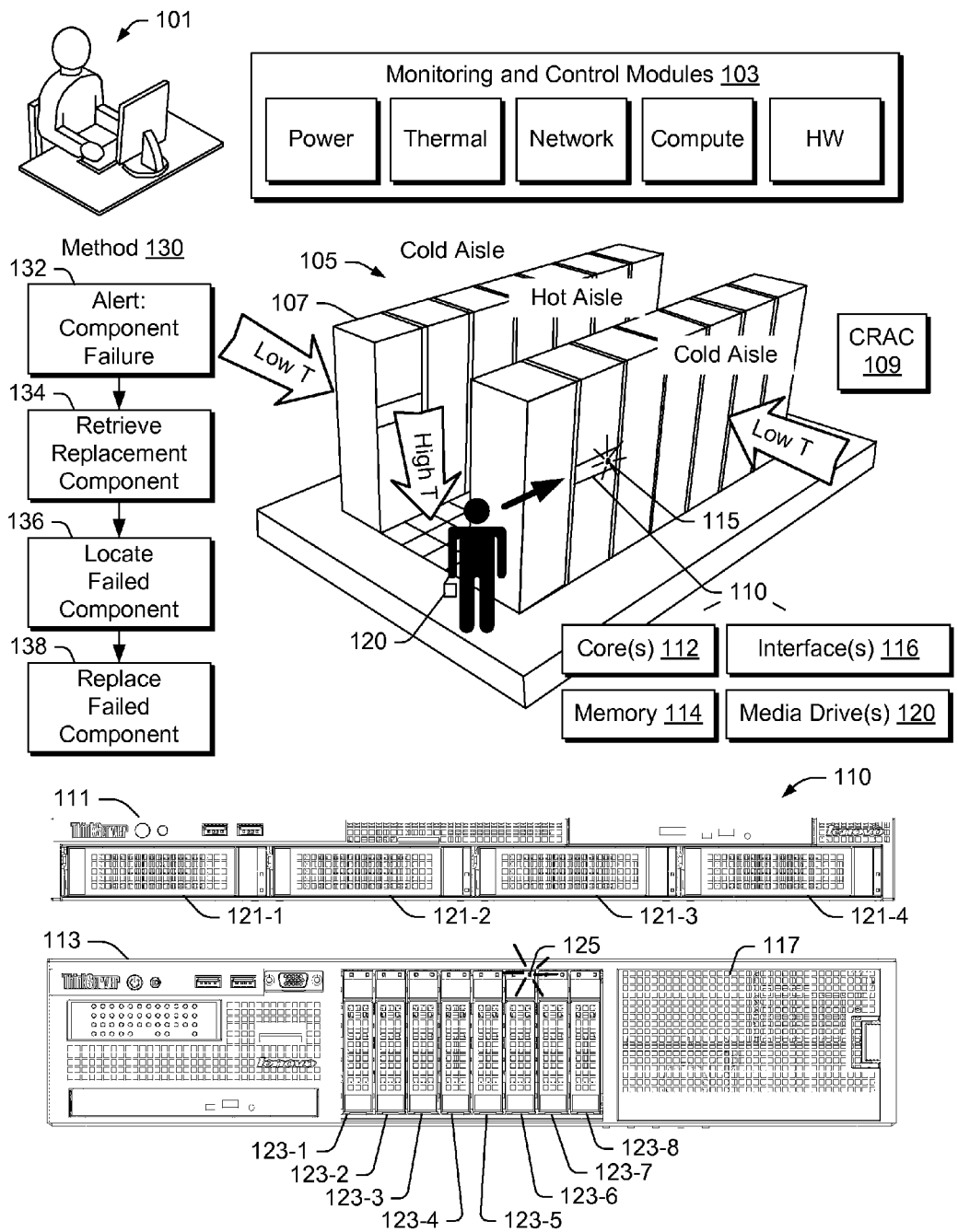
FIG. 1 is a series of diagram related to examples of servers and server operations.

FIG. 1 shows an individual at a control station 101 where the control station 101 may operate in conjunction with one or more modules such as one or more of the monitoring and control modules 103. In the example of FIG. 1, the modules 103 include a power module, a thermal module, a network module, a compute module and a hardware module. The modules 103 may be configured to monitor and control a group of servers 105, which may be arranged in rack towers 107. For example, each of the rack towers 107 may include one or more server unit 110. Each server unit 110 may include one or more processing cores 112, memory 114, one or more interfaces 116 and one or more media drives 120. As an example, each server unit 110 may be configured to access information stored in a media drive 120, transfer accessed information to memory 114, perform computational operations on information in memory 114 and communicate results from computational operations via an interface 116 (e.g., a network interface). As another example, each server unit 110 may be configured to receive information via an interface 116, transfer such information to memory 114 and store such information in a media drive 120. As described herein, each server unit 110 may be configured according to one or more of the foregoing examples or additionally or alternatively according to one or more other manners of operation. Further, as described herein, a server unit includes a server chassis, for example, configured from materials such as metal, plastic, etc., for seating various components.

FIG. 1 also shows a computer room air conditioning (CRAC) unit 109. The CRAC unit 109 is typically a device that monitors and maintains temperature, air distribution and humidity in a network room or data center. In the example of FIG. 1, the CRAC unit 109 may be controlled, monitored, etc., via the one or more modules 103 (e.g., via the control station 101). Mainframes and racks of servers can get as hot as a seven-foot tower of powered toaster ovens, so climate control is an important part of a data center's infrastructure. There are a variety of ways that a CRAC unit can be situated. As an example, a CRAC unit setup can process cooling air and dispense the cooling air (e.g., through an elevated floor). In such an example, cold air flows through the racks (e.g. from "cold aisles") where it picks up heat before exiting from the rear of the racks (e.g., to "hot aisles") and returns to the CRAC unit intake(s). CRAC units in a data center can consume a large fraction of total operational energy. For example, CRAC units may consume 25% or more of the total electricity used by a data center.

FIG. 1 shows two examples of server units 111 and 113. The server units 111 and 113 have substantially rectangular faces configured with bays that seat one or more media drives. As described herein, a bay may refer to an opening defined by at least two walls, which may be configured to receive one or more media drives (e.g., in media drive trays). Each position in a bay configured to receive more than one media drive may be referred to as a media drive bay. Server units such as the units 111 and 113 may be stackable in the towers 107 of the group 105. The example server unit 111 includes four horizontally oriented bays that seat four media drives 121-1, 121-2, 121-3 and 121-4. The example server unit 113 includes a large bay configured with eight vertically oriented media drive bays that seat eight media drives 123-1, 123-2, 123-3, 123-4, 123-5, 123-6, 123-7 and 123-8. The server unit 113 also includes a flush, vented cover 117 that covers an additional unused bay, which upon removal of the cover may optionally seat up to eight additional media drives. As described herein, a media drive may be a hard disk drive (HDD), a solid-state drive, an optical drive or other type of media drive. A HDD may be a standard 2.5 inch drive, a standard 3.5 inch drive or another drive.

Where media drives generate heat, heat is transfer to a cooling fluid (e.g., air), which causes the fluid to rise from an inlet temperature $T_{in}$ to an outlet temperature $T_{out}$. Referring to the examples of FIG. 1, the server unit 111 allows for flow around each media drive 121-1, 121-2, 121-3 and 121-4 as seated in their respective bays. In the server unit 113, heat may be transferred from a media drive (see, e.g., 123-1 to 123-8) to cooling fluid flowing in a gap between adjacent media drives or between a media drive and a wall components of a bay. Heat transfer may be characterized at least in part by the equation: $\Delta Q/\Delta t = h_{plate} A (T_{plate} - T_{in})$. In this equation, the flux of energy ($\Delta Q/\Delta t$) is equal to the heat transfer coefficient for a plate ($h_{plate}$), the area of the plate (A) and the temperature difference between the plate and the cooling fluid ($T_{plate} - T_{in}$). For such an equation, a plate may be a surface of a media drive or other component of a server unit. Heat transfer may optionally be characterized by Reynolds number (ratio of inertial forces to viscous forces), Prandtl number (ratio of kinematic viscosity and thermal diffusivity), Nusselt number (ratio of convective to conductive heat transfer across a surface) or Grashof number (ratio of the buoyancy to viscous force acting on a fluid).

As described herein, velocity of cooling fluid can be important for effective cooling and managing energy costs. In particular, axial velocities (e.g., z direction into a bay) of fluid flowing adjacent a media drive seated in a media drive assembly can be important. As described herein, a media drive assembly can act to increase heat transfer coefficient ($h_{plate}$) compared to a conventional media drive assembly. Heat transfer depends on various factors. Where obstructions to flow exist, flow is impeded, which diminishes momentum and typically velocity (e.g., for constant cross-sectional flow area). Accordingly, as described herein, various media drive assembly components can allow for a more unimpeded flow and enhancement of flux of energy from a media drive to a cooling fluid.

As described herein, various keyed components can ensure that media drive assemblies are installed properly into a bay or bays. For example, for the server unit 113, the media drives 123-1 to 123-8 are seated in a relatively uniform manner whereby clearances and heat generation and transfer patterns may be fairly well-known or otherwise understood a priori. More specifically, where conventional components allow for more than one orientation of a media drive in a bay, the selected orientation may not correspond to the most favorable orientation for purposes of heat transfer (e.g., for cooling). Indeed, one side of a media drive may get hotter than another side and where multiple orientations are possible, an operator may install two hot sides adjacent each other. Such situations can give rise to local temperature control issues, which may compromise operation (e.g., increase risk of failure, decrease longevity, etc.). Accordingly, as described herein, keyed components, optionally in combination with other components or features, can act to decrease uncertainty as to cooling and promote operational certainty.

FIG. 1 shows an example of a method 130 that includes an alert block 132, a retrieval block 134, a locate block 136 and a replace block 138. For example, a monitoring module may detect failure of a component in the group 105 and, per the alert block 132, issue an alert. As described herein, an alert may include lighting a diode associated with the failed component. For example, each tower in a server group (or server farm) may include a series of diodes where an alert causes emission of light from a diode where the light is transmitted via a light pipe (or guide) to a face of a server unit (see, e.g., end of light pipe 115 as associated with the server unit 110). Per the method 130, a retrieval block 134 calls for retrieval of a replacement component, which may be a manual or automated (e.g., robotic) process. Per the locate block 136, the failed component is located, for example, by an operator that may visually inspect the towers and associated server units to locate the particular, failed component. Again, in the example of FIG. 1, the light pipe end 115 facilitates visual location of a failed component. Once located, per the replace block 138, an operator may remove the failed component and replace it with the retrieved replacement component.

In general, the method 130 should be performed in a timely and accurate manner. As described herein, a server unit may include a substantially flush face such that visual inspection of a tower or group of towers readily reveals a status indicator (e.g., diode, end of light pipe, etc.). For example, the server unit 111 or the server unit 113 may be configured with a substantially flush face to avoid blocking emission of light from a status indicator and to allow for viewing of a status indicator from wide angles and many lines of sight. For example, the server unit 113 includes the media drive 123-6 with a status indicator 125 that can emit light in wide angle cone, substantially free from interference from other features of the server unit 113. As described herein, keyed components (e.g., of a bay, a tray, a bay and tray, etc.) that promote uniformity can also decrease visual complexity and allow for an enhanced visual environment that facilitates locating and replacing troubled components.

Referring to the example server units 111 and 113, visual uniformity is enhanced by providing media drive assemblies with vented handles where the vents have a pattern that matches other vent patterns of the server units 111 and 113. For example, the server units 111 and 113 include rectangular air flow passages over various portions of their faces, including the handles of the media drive assemblies 121-1, 121-2 and 121-3 as well was 123-1 to 123-8. Accordingly, when a status light is illuminated, the reduced visual complexity of the vents actually enhances a user's ability to locate the illuminated status light. Further, where the server units 111 and 113 are provided in a dark finish (e.g., black finish), contrast between a face of a server unit and an illuminated status light is enhanced. As mentioned, keyed components can act to ensure that handles face the same direction, which can reduce confusion and expedite replacement of a media drive (e.g., a media drive of a media drive assembly seated in a bay).

Figure 2:
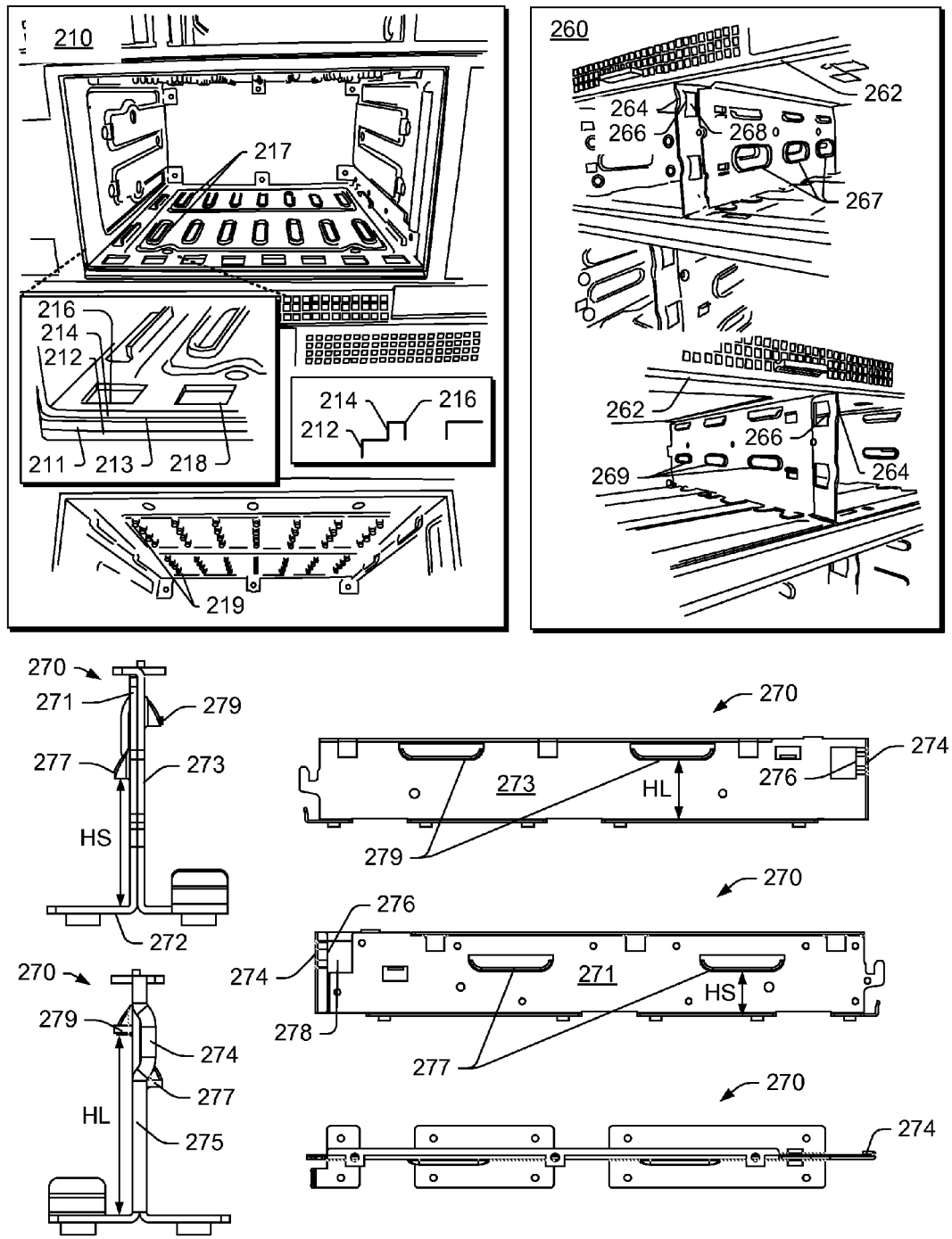
FIG. 2 is a series of diagrams of examples of bays and bay components.

FIG. 2 shows views of some examples of bays 210 and 260 and a bay component 270. The bay 210 is configured to accommodate eight media drives oriented vertically (e.g., eight individual media drive bays) and the bay 260 is configured to accommodate two media drives oriented horizontally between an end wall and an interior wall, two interior walls or two end walls (e.g., two individual media drive bays). The bay component 270 is formed from two plates 271 and 273, bent to form a base 272, and an end cover 275 (e.g., formed by a 180 degree bend of the plate 273) where each of the plates 271 and 273 is configured to abut an edge of a rail attached to a media drive along one or more punch-out portions or protrusions 277 and 279 that extend outwardly from respective plates 271 and 273. As described herein, by bending the plate 273 by 180 degrees, the end thickness is doubled, which provides for additional integrity to a surface 274. As described herein, the surface 274 can be leveraged by an end of a handle to translate a media drive assembly (e.g., to extract a media drive assembly from a bay).

Referring to the bay 210, for each media drive position in the bay, a first front facing surface 212 steps to a shoulder with a recessed, second front facing surface 214. The recessed front facing surface 214 of the shoulder rises to a flat surface which extends inwardly in the bay to a stop surface 216, which may be, for example, an edge of an opening 218. As described herein, for the bay 210, the surface 212 may be a surface of a bezel component 211 while the recessed surface 214 and the stop 216 may be surfaces of a bay component 213 that abuts the bezel component 211. The bay component 213 includes protrusions 217 that separate media drive positions and define slots where the protrusions 217 are configured to abut at least one edge of a rail attached to a media drive (e.g., one edge of one rail of a media drive and one edge of another rail of another media drive). As described herein, each of the protrusions 217 and each of the openings 218 may optionally be formed by punching a piece of sheet metal. In the example of FIG. 2, a top side of the bay 210 includes a series of nubs 219 that separate media drive positions and define slots where the series of nubs 219 are configured to abut at least one edge of a rail attached to a media drive (e.g., one edge of one rail of a media drive and one edge of another rail of another media drive).

Referring to the bay 260, a first front facing surface 262 steps to a shoulder with a recessed, second front facing surface 264. The recessed front facing surface 264 traverses to a curved surface that extends inwardly to a stop 266, which may be, for example, an edge of an opening 268. As mentioned, the bay 260 is configured to receive two media drives, stacked and oriented horizontally. The bay 260 includes sets of protrusions 267 on one side and sets of protrusions 269 on another side. For example, a lower set of protrusions provide for alignment of an upper edge of a rail attached to a first media drive seated in a lower bay position as well as alignment of a lower edge of another rail attached to a second media drive seated in an upper bay position while an upper set of protrusions provide for alignment of a lower edge of the rail attached to the second media drive seated in the upper bay position.

Various features of the bay component 270 appear correspondingly in the bay 260. For example, the surface 274 corresponds to the recessed surface 264, the stop 276 corresponds to the stop 266, and the opening 278 corresponds to the opening 268. Noting that the bay 260 includes one set of features for each media drive position. As shown in the example of FIG. 2, by folding an end of the plate 273 180 degrees, the thickness is doubled and the stop 276 may be formed or strengthened. As described herein, such a fold (or bend) can provide for the surface 274 and the stop 276, with sufficient integrity to lock a media drive assembly in a bay (i.e., via the stop 276) and to extract a media drive assembly from a bay (i.e., via the surface 274), for example, to translate the media drive assembly a distance that decouples a connector.

In the examples of FIG. 2, each of the bays 210 and 260 has keyed components. More specifically, each individual media drive position of a bay has a side with a small clearance height HS and a side with a large clearance height HL. For example, the plate 271 of the bay component 270 has a small clearance height HS defined by the protrusions 277 while the plate 273 of the bay component 270 has a large clearance height HL defined by the protrusions 279. Hence, the bay component 270 is a keyed component that defines, in part, two media drive positions in a bay. As described in more detail below, the component 270 can cooperate with a keyed rail of one media drive tray and a keyed rail of an adjacent media drive tray to ensure installation of the media drive trays in a uniform manner.

Also shown in FIG. 2, for the plate 271 of the bay component 270, the protrusions 277 define a clearance height HS that is less than the height of the surface 274. Such an arrangement allows for the surface 274 to be curved inward as a rail that defines the width of tray portion of a media drive assembly need only clear the portion of the bay below the height of the protrusions 277 (height HS).

Figure 3:
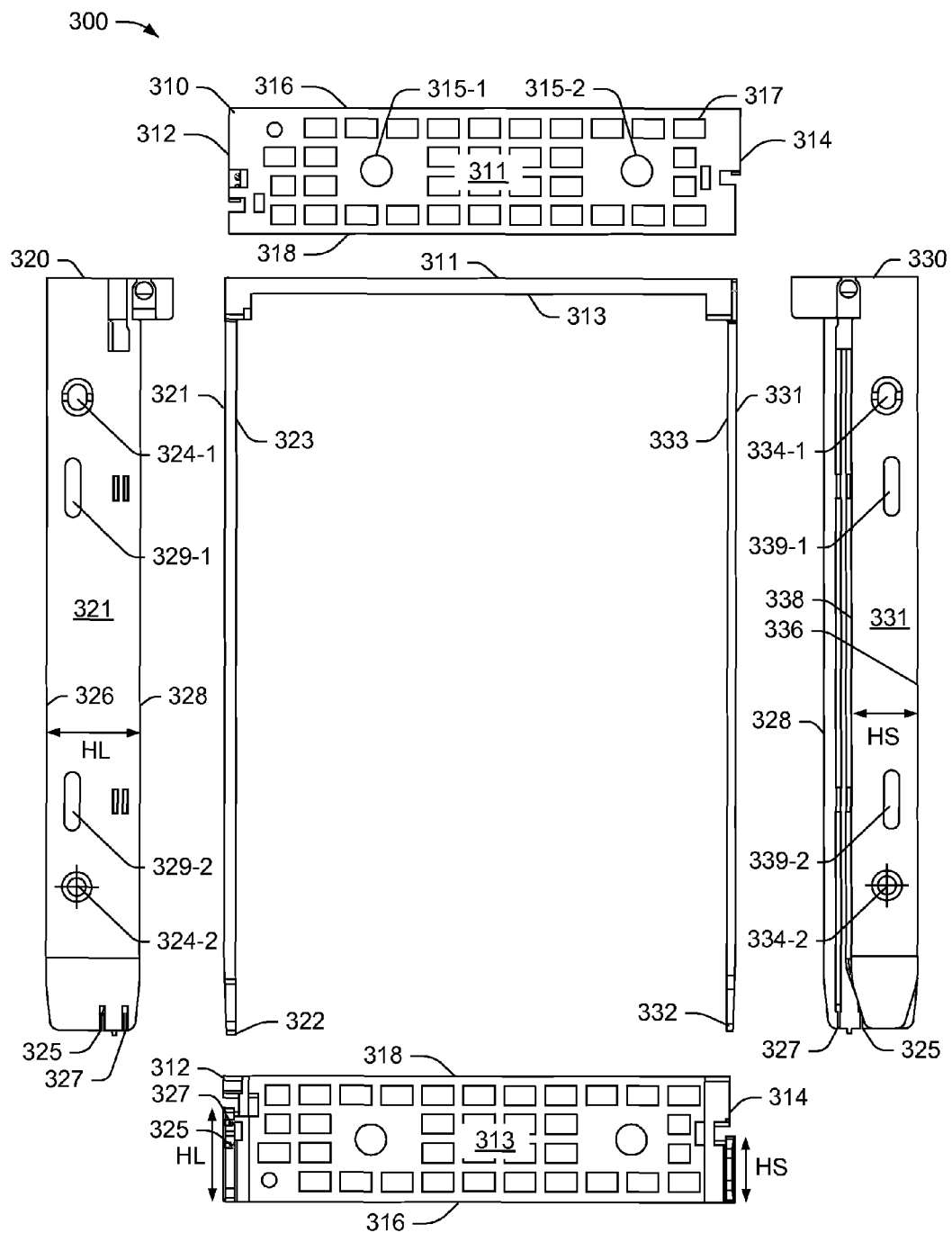
FIG. 3 is a series of views of an example of a tray for a media drive.

FIG. 3 shows various views of an example of a tray 300 with rails 320 and 330 configured for attachment to a media drive. In the example of FIG. 3, the tray 300 includes a front plate 310 with a front surface 311 and a back surface 313. As shown, the rails 320 and 330 extend outwardly from the back surface 311 perpendicular to a plane defined by the front plate 310. The front plate 310 includes opposing sides 312 and 314, a top edge 316 and a bottom edge 318. The front plate 310 includes features 315-1 and 315-2 for attachment to a handle unit (e.g., to facilitate installation and removal of a media drive from a bay). The front plate 310 also includes passages 317 for flow of air, for example, for cooling a media drive secured in the tray 310 and seated in a bay.

In the example of FIG. 3, the rails 320 and 330 are different. Specifically, one rail has a different configuration than the other rail; accordingly, the rails are asymmetric (i.e., not merely right hand/left hand mirror images) and, as described herein, keyed. As shown in the example of FIG. 3, the rail 320 is larger with a greater height (HL) than the rail 330 (HS). Further, the rail 320 includes at least one light guide 325 and 327 (e.g., for transmitting light signals as to status of a media drive, etc.). The rail 320 has a free end 322, a bay side surface 321, a media drive side surface 323, a lower edge 326 and an upper edge 328. In the example of FIG. 3, the rail 320 includes attachment features 324-1 and 324-2 as well as openings 329-1 and 329-2. As described herein, the free end 322 may be shaped to facilitate insertion. For example, one or more of the edges 326 and 328 may be beveled (e.g., chamfered or sloped) to facilitate alignment and ease of fit with respect to corresponding features of a bay (see, e.g., the protrusions 279).

As shown, the rail 330 is smaller with a smaller height (HS) than the rail 320 (HL). The rail 330 has a free end 332, a bay side surface 331, a media drive side surface 333, a lower edge 336 and an upper edge 338. In the example of FIG. 3, the rail 330 includes attachment features 334-1 and 334-2 as well as openings 339-1 and 339-2. As described herein, the free end 332 may be shaped to facilitate insertion. For example, one or more of the edges 336 and 338 may be beveled (e.g., chamfered or sloped) to facilitate alignment and ease of fit with respect to corresponding features of a bay (see, e.g., the protrusions 277).

Referring again to FIG. 2, the clearances HL and HS of the component 270 may be configured to accommodate the rail 320 of height HL and the rail 330 of height HS. For example, a single media drive position in a bay may be defined as existing between two of the components 270 such that, for the tray 300, the edge 328 of the rail 320 abuts protrusions 279 of one component 270 and the edge 338 of the rail 330 abuts protrusions 277 of another component 270. In another example, one side of a media drive position in a bay may be a wall (e.g., a server unit wall or a rack wall) that includes protrusions that define a clearance HS or HL. In yet other examples, spaced walls may include protrusions; one wall with defined clearances HS and the other wall with defined clearances HL (see, e.g., the bay 210 of FIG. 2). Further, as shown in the bay 260 of FIG. 2, a wall component may define slots for multiple media drive assemblies (see, e.g., sets of protrusions 267 that define small clearances and sets of protrusions 269 that define larger clearances).

Figure 4:
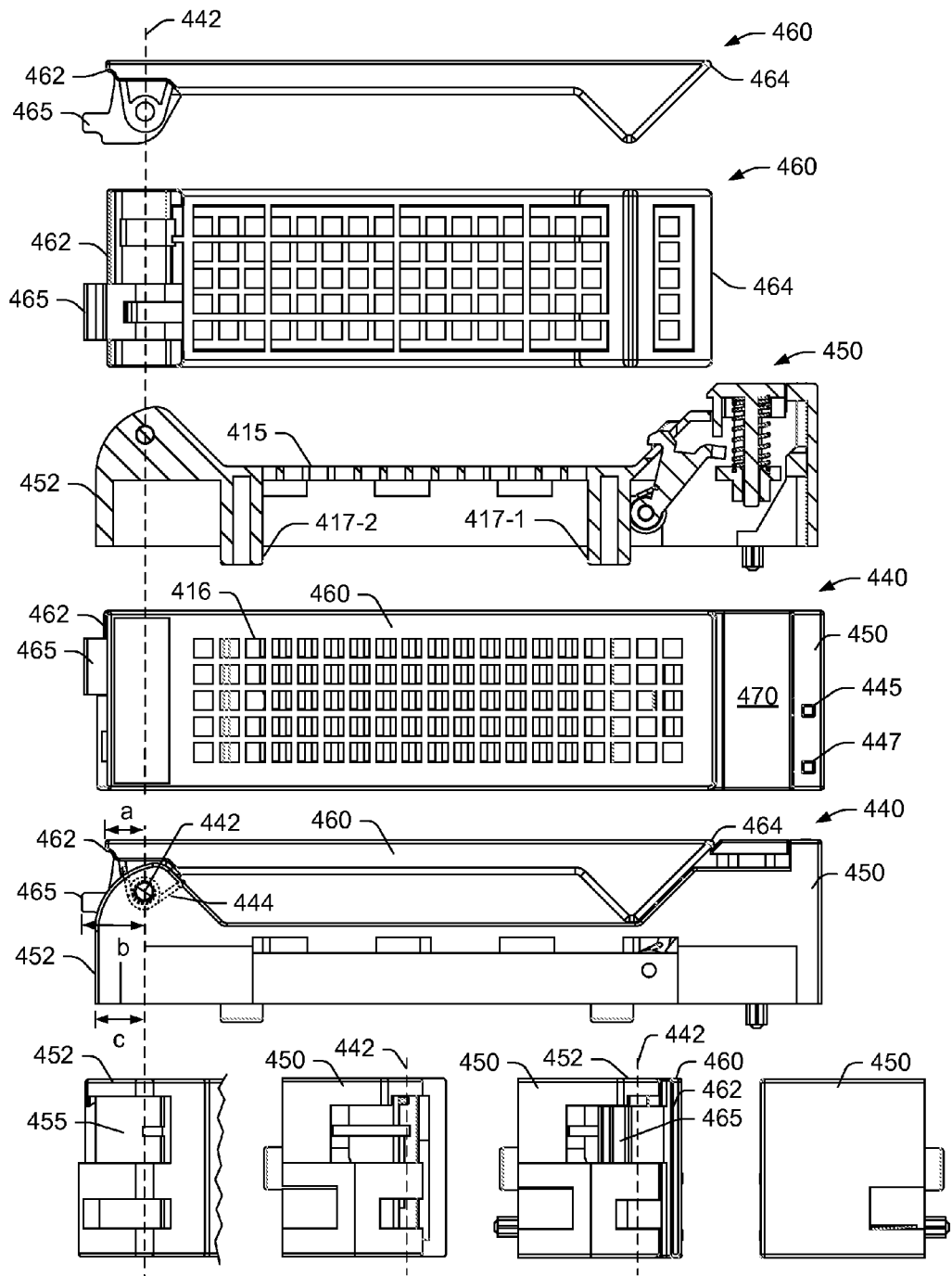
FIG. 4 is a series of views of an example of a handle unit for a media drive assembly.

FIG. 4 shows a handle unit 440, which is an assembly of components. In the example of FIG. 4, the handle unit 440 includes a base 450 and a handle 460. The base 450 includes a hinge end 452 having a hinge axis 442. The handle 460 includes a hinge end 462, a locking tab 465 and a swing end 464. In FIG. 4, a dashed line indicates the position of the hinge axis 442, either along the axis or at the end of the axis. A pin or pins may act to define the hinge axis 442 and provide for rotation of the handle 460 with respect to the base 450.

As described herein, the handle 440 is configurable in a locked orientation and an unlocked orientation with respect to the base 450 where the locked orientation corresponds to a locked angle of rotation of the handle 460 about the hinge axis 442 having an end of the locking tab 465 rotated outwardly away from the hinge end 452 of the base 450, the swing end 464 of the handle 460 rotated inwardly toward the base 450 and the hinge end of the base 452 extending outwardly beyond the hinge end 462 of the handle 460 and where the unlocked orientation corresponds to an unlocked angle of rotation of the handle 460 about the hinge axis 442 having an end of the locking tab 452 rotated inwardly toward the hinge end 452 of the base 450, the swing end 464 of the handle 460 rotated outwardly away from the base 450 and the hinge end 462 of the handle 460 extending outwardly beyond the hinge end 452 of the base 450. In the locked orientation, air may flow through air flow passages 416 of the handle 460 and air flow passages 415 of the base 450. Such passages may allow for flow of air via passages 317 of the front plate 310 of the tray 300 where the tray is attached to the base 450 (see, e.g., posts 417-1 and 417-2, which may cooperate with features 315-1 and 315-2 of the tray 300 via screws, plugs, bolts, etc.).

FIG. 4 shows distances a, b and c, which correspond to dimensions measured from the hinge axis 442 to the hinge end 462 of the handle 460 ("a"), the hinge axis 442 to an end of the locking tab 465 ("b") and from the hinge axis 442 to the hinge end of the base 452 ("c"). Accordingly, in the locked orientation, the hinge end 452 of the base 450 extends outwardly beyond the hinge end 462 of the handle 460 (i.e., c>a). Such an arrangement allows for the hinge end 462 of the handle 460 to contact a recessed surface (see, e.g., surfaces 214, 264 or 274) of a bay component and allow the handle 460 to be flush with a surface of a server rack or unit (see, e.g., surfaces 212 or 262).

Also shown in the example of FIG. 4, the locking tab 465 is positioned along an upper half of the assembly 440 and opposite the side with one or more status indicators 445 and 447 (see, e.g., light guides 325 and 327 of FIG. 3). Such an arrangement of features allows for the smaller rail 330 (e.g., without the light guides) to be positioned below the surface 274 of the bay component 270 (e.g., aligned per the protrusion 277) where the surface 274 can be curved inwardly towards the bay and available as a contact point for leverage by a biasing surface of the hinge end 462 of the handle 460. As shown in the bay 260 of FIG. 2, a bay component may include one such surface per media drive position in a bay, which, upon assembly of a bay, becomes a recessed surface (e.g., in comparison to the surface 262).

In the example of FIG. 4, a release button 470 is seated in the base 450, which may release the swing end 464 of the handle 460 when depressed (e.g., a predetermined distance). Further, a spring 444 biases the handle 460 about the hinge axis 442 with respect to the base 450. Accordingly, upon release of the swing end 464, the spring 444 causes the swing end 464 of the handle 460 to swing outwardly, rotating about the hinge axis 442 such that the hinge end 462 and the locking tab 465 rotate inwardly. As shown in the example of FIG. 4, the locking tab 465 rotates inwardly to a chamber 455 at the hinge end 452 of the base 450.

Figure 5:
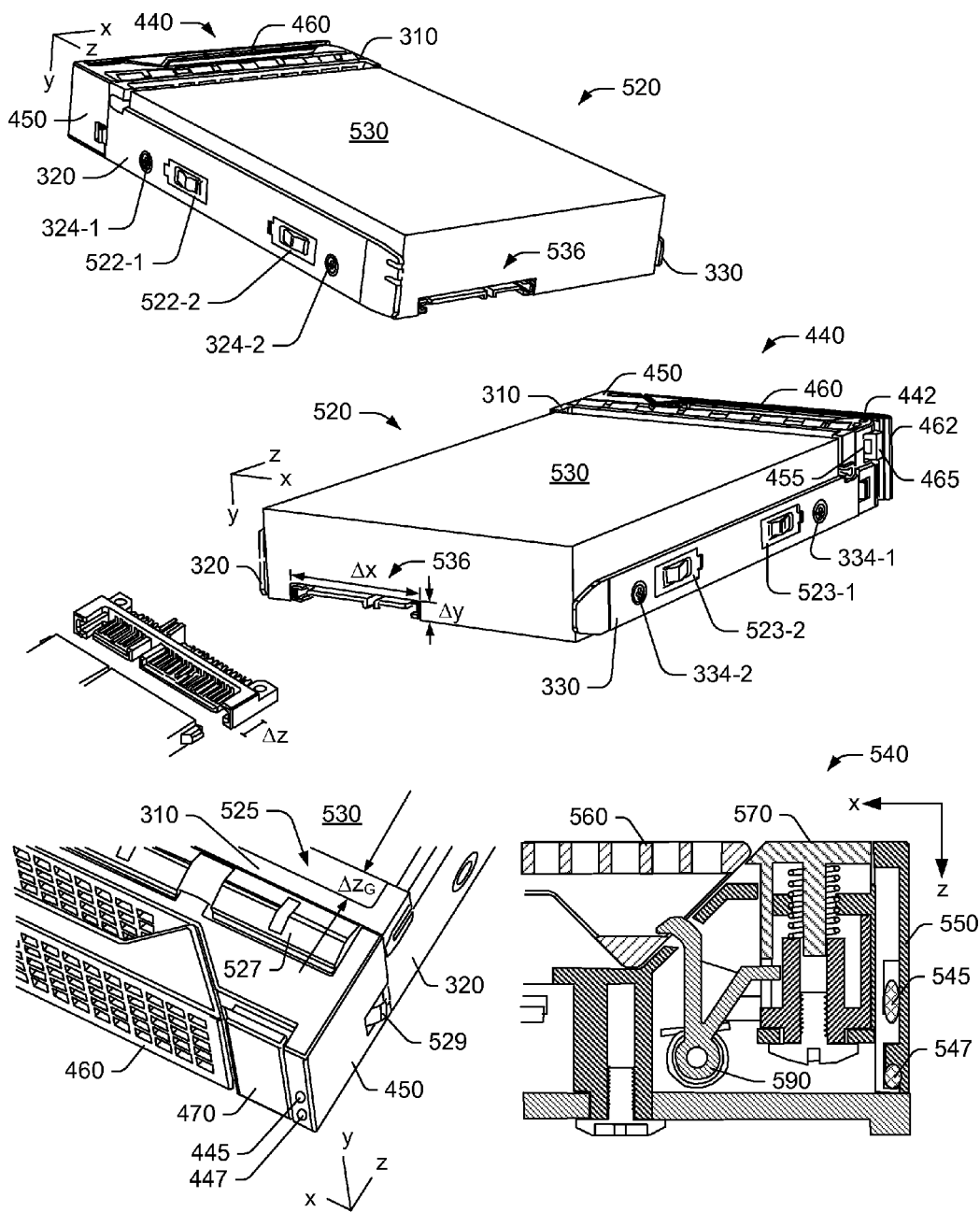
FIG. 5 is a series of perspective views of an example of an assembly with a media drive and a cross-sectional view of an example of an assembly.

FIG. 5 shows perspective views of an example of an assembly 520 that includes a media drive 530 and a cross-sectional view of an example of an assembly 540. The assembly 520 includes the tray 300 and the handle unit 440. In the example of FIG. 5, the rail 330, which has a smaller height (e.g., along a y-coordinate) compared to the rail 320, is attached to a side of the media drive 530 that corresponds to the hinge end 462 of the handle 460, as well as the locking tab 465. The arrangement of these features, in conjunction with features of a bay, can allow for the handle 460 to be flush with a face of a server unit (or rack) or optionally even recessed from a face of a server unit (or rack).

Also shown in FIG. 5 is a gap 525 between the front plate 310 of the tray 300 and a front surface of the media drive 530. The gap 525 has a dimension $\Delta z_G$, which allows for flow of air from the various air passages of the handle 460, the base 450 and the front plate 310. The distance of the gap 525 may be determined, at least in part, by the attachment features 324-1 and 324-2 of the rail 320 and the attachment features 334-1 and 334-2 of the rail 330. FIG. 5 further shows springs 522-1 and 522-2 fit to the rail 320 via the openings 329-1 and 329-2, respectively, and springs 523-1 and 523-2 fit to the rail 330 via the opening 339-1 and 339-2, respectively. The springs 522-1, 522-2, 523-1 and 523-2 provide for biasing the assembly 520 in a bay, for example, against bay plates. Such springs can act to improve fit in a bay and reduce transmission of vibrations from a bay to a media drive and vice versa. An assembly may include other types of springs or clips, for example, clips 527 mounted between the base 450 and the front plate 310 of the tray 300 can improve fit and reduce transmission of vibrations and springs 529 mounted on each side of the base 450 between the base 450 and a respective rail 320 and 330 of the tray 300 can improve fit and reduce transmission of vibrations.

In the example of FIG. 5, the media drive 530 is shown as having a back side connector or connectors 536 configured for connecting the media drive 530 to a power source, information bus, etc. In the example of FIG. 5, the connector 536 has a depth dimension ($\Delta z$), which represents a sliding distance, for example, between two components from being in contact with each other to fully connected or from fully connected to being disconnected from each other. Connector components should be appropriately positioned and moved with some assurances of alignment to avoid abnormal wear, misconnection or failure. In particular, electrical contact between mating connector surfaces should be maintained upon installation of the assembly 520 in a bay and, upon removal, sliding of the mating connector surfaces should occur with relatively uniform motion in a uniform manner (e.g., to provide assurances as to durability, cycling, etc.).

As described herein, a server unit or chassis can include one of more types of bays for receipt of one or more types of media drives where each drive is carried in a tray with a handle unit, sometimes referred to as a caddy. Such media drives may optionally be of a so-called "small form factor" (SFF), for example, consider the SFF 3.5 inch or SFF 2.5 inch standards, which are common for hard disk drives (HDDs).

The assembly 520 and the assembly 540 of FIG. 5 are shown as including status indicators 445 and 447 and 545 and 547, which may be ends of light pipes or guides. In the cross-sectional view of the assembly 540, the light guides are shown as passing through a base 550. The cross-sectional view also shows other components such as a handle 560, a button 570, and a latch 590 in an alternative configuration compared to the configuration of the handle unit 440.

Figure 6:
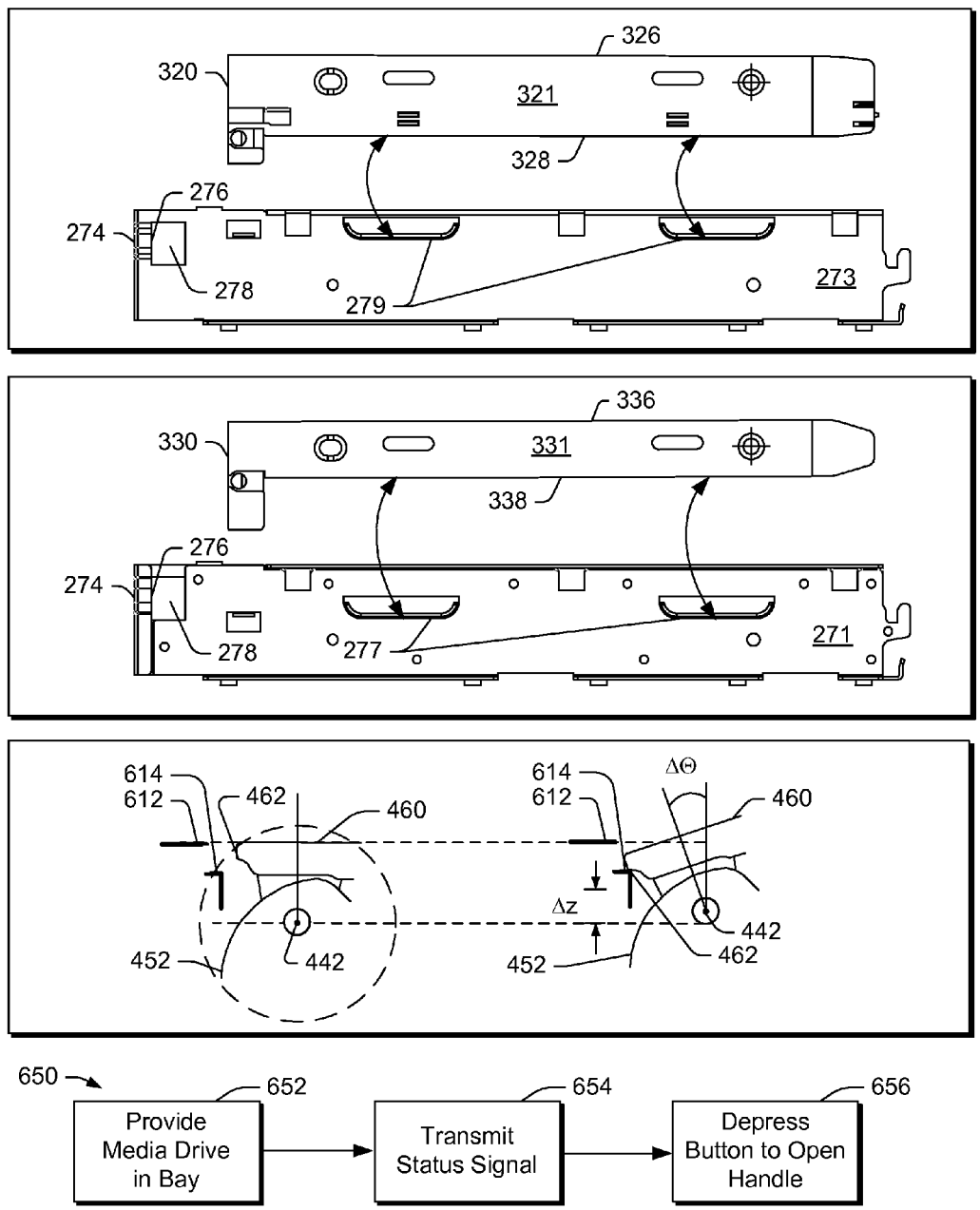
FIG. 6 is a series of views of examples of features of a keyed assembly and a block diagram of a method.

FIG. 6 shows views of the rails 320 and 330 with respect to the bay component 270, an end view of how the handle unit 440 cooperates with features of a bay and a block diagram of an example of a method 650.

As shown in FIG. 6, the upper edge 328 of the rail 320 cooperates with lower edges of the protrusions 279 of the plate 273 of the bay component 270. In such an arrangement, the outer surface 321 of the rail 320 is positioned adjacent the plate 273. As shown in FIG. 6, the upper edge 338 of the rail 330 cooperates with lower edges of the protrusions 277 of the plate 271 of the bay component 270. In such an arrangement, the outer surface 331 of the rail 330 is positioned adjacent the plate 271.

Also shown in FIG. 6, bay features include a first front facing surface 612; a recessed, second front facing surface 614 (see, e.g., the surface 274 of the component 270); and a stop 616 (see, e.g., the stop 276 of the component 270). In the example of FIG. 6, for a closed or locked orientation, the handle 460 is aligned flush with the first front facing surface 612 while the locking tab 465 is received by an opening 618 where the stop 616 is an edge of the opening 618. Accordingly, the stop 616 prevents forward movement of the handle unit 440 with respect to the bay and thereby acts to lock the handle unit 440 in the bay. In such a locked orientation, the angle of rotation of the handle 460 with respect to the base 450 may be considered approximately 0 degrees. Further, in the locked orientation, the hinge end 452 of the base 450 extends outwardly beyond the hinge end 462 of the handle 460.

Upon release of the swing end 464 of the handle 460 (e.g., by depressing the button 470 or other release mechanism), the handle 460 rotates about the hinge axis 442, optionally assisted by the spring 444, to an open or unlocked orientation. Rotation of the handle 460 results in the hinge end 462 extending outwardly beyond the hinge end 452 of the base 450 to allow for contact with the recessed surface 614 (see, e.g., radius of dashed circle as to movement of the hinge end 462 of the handle 460).

Where the spring 444 acts to bias the handle 460 with respect to the base 450, the spring 444 may rotate the handle 460 about the hinge axis 442 to an angle (or an angle interval) that brings the hinge end 462 of the handle 460 in contact with the second front facing surface 612. Upon further rotation of the handle 460 about the hinge axis 442, the handle unit 440 is translated forward in the bay (e.g., consider angle interval ΔΘ). According to the example of FIG. 6, the handle 460 is configured to rotate an amount (e.g., an angle interval) about the hinge axis 442 whereby contact between the hinge end 462 and the front facing surface 614 of a bay causes translation of an assembly a distance sufficient to disconnect (e.g., decouple) electrical contacts of one or more connectors of a media drive of the assembly (see, e.g., the dimension Δz).

As described herein, a media drive tray can include a front plate; a first rail extending from and perpendicular to the front plate where the first rail includes features for securing the first rail to a media drive and a first rail height; and a second rail extending from and perpendicular to the front plate, parallel to the first rail, where the second rail includes features for securing the second rail to a media drive and a second rail height that differs from the first rail height. In such an example, the front plate can include air flow passages. As described herein, a tray can include features for securing a first rail to a media drive and features for securing a second rail to a media drive that provide for an air flow gap between a media drive and a front panel from which the rails extend.

As described herein, a media drive tray can include a rail with at least one light guide. In such an example, a rail with a greater rail height can include the at least one light guide. In various examples, one or more rails can include a beveled end (e.g., to facilitate positioning a rail with respect to a slot).

As described herein, a front plate of a tray can include attachment features for attaching the front plate to a handle unit. A front plate may have a height that exceeds a first rail height and a second rail height. As described herein, a front plate, a first rail and a second rail of a tray may have a U-shape. As described herein, a first rail can include a lower edge aligned with a lower edge of the second rail.

In the example of FIG. 6, the method 650 includes a provision block 652 for providing, in a media drive bay, a media drive secured between a first rail that has a first rail height and a second rail that has a second rail height that exceeds the first rail height where the first rail and the second rail extend from a front plate; a transmission block 654 for transmitting a status signal through a light guide of the second rail where the status signal indicates a status of the media drive; and a depression block 656 for depressing a button of a handle unit attached to the front plate to open a handle, for example, to allow for removal, from the bay, the media drive as secured between the rails (e.g., where the status signal indicates that a problem exists with the media drive).

As described herein, a method can include providing a media drive in a media drive bay that includes a first slot that has a first slot height approximately equal to a first rail height and a second slot that has a second slot height approximately equal to a second rail height.

As described herein, a method can include cooling a media drive seated in a tray by drawing air through air flow passages of a front plate of the tray. As described herein, a method can include transmitting a status signal through a light guide of a rail and to a light guide of a handle unit attached to the front plate.

Figure 7:
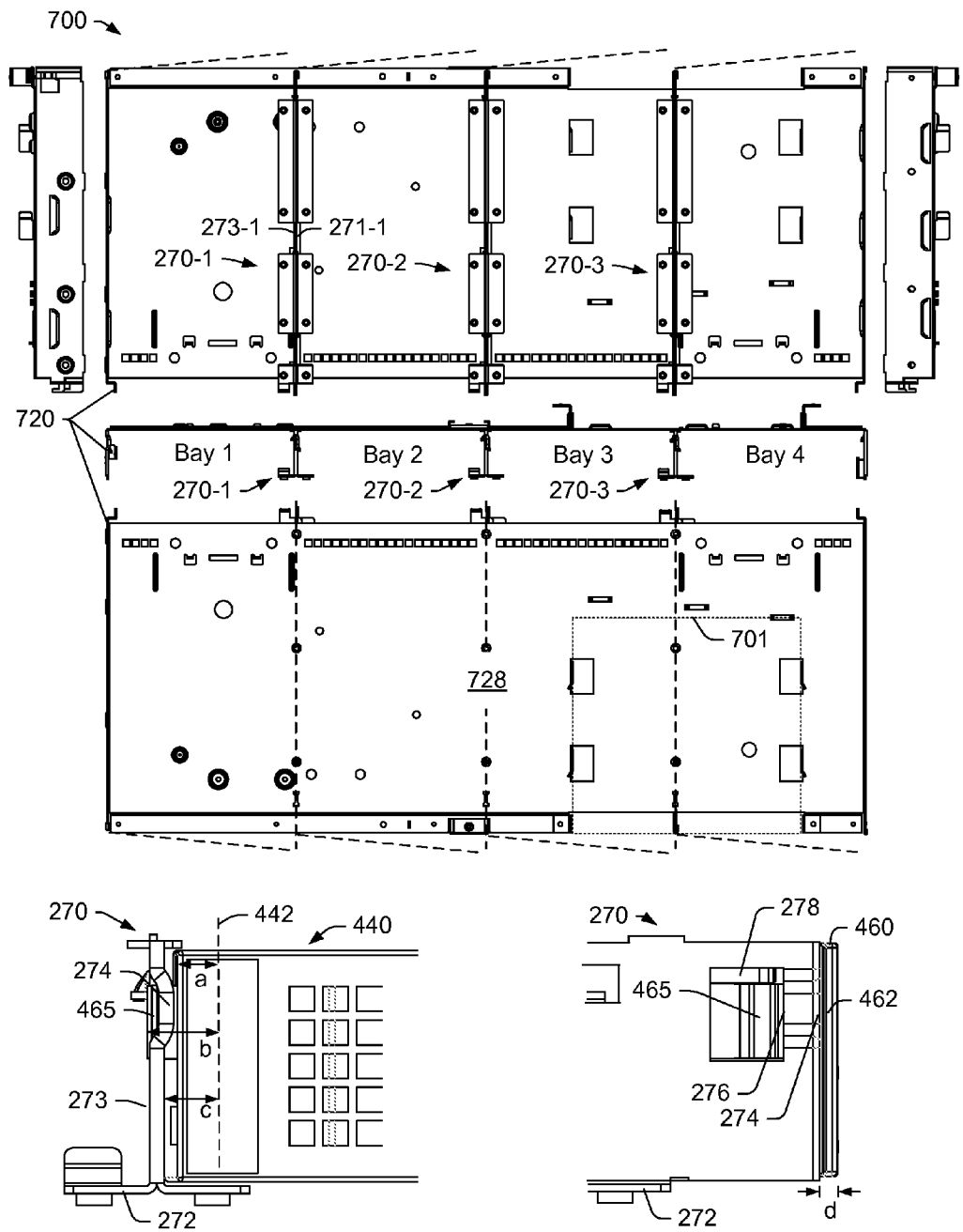
FIG. 7 is a series of views of an example of a bay assembly and views of a media drive assembly positioned with respect to a bay component.

FIG. 7 shows various views of an assembly 700 that includes an elongated U-shaped component 720 with a series of bay components 270-1, 270-2 and 270-3 attached thereto to form four separate media drive positions (e.g., bay 1, bay 2, bay 3 and bay 4). FIG. 7 also shows a front view and a side view of portions of the assembly 440 with respect to the bay component 270 along with distances or dimensions a, b and c as well as d, which represents a distance or dimension between the surface 274 and a front surface of the handle 460. According to the example of FIG. 7, as the handle 460 rotates, the hinge end 462 of the handle 460 contacts the front facing surface 274 of the bay component 270, which forces the assembly 440 to translate outwardly with respect to the bay component 270. In the example of FIG. 7, the location of the curved surface 274 is above the protrusion 277, which is configured to accommodate a rail attached to a media drive (see, e.g., smaller rail 330 of FIG. 3). In various examples, the distance between a hinge axis and a biasing edge of a hinge end of a handle (see, e.g., dashed circle in FIG. 6) may determine, in part, dimensions a, b and c or relationships between two or more of these dimensions. Further, the shape or dimensions of the surface 274 of the component 270 may depend on a distance between a hinge axis and a biasing edge of a hinge end of a handle.

In FIG. 7, a side view of the bay component 270 and the assembly 440 indicates alignment of the locking tab 465 with respect to the stop 276 and the opening 278 of the bay component 270. Similar arrangements may exist between an assembly and features of the bay 210 of FIG. 2, between an assembly and features of the bay 260 of FIG. 2, etc. As indicated, the arrangement of the locking tab 465 with respect to the stop 276 may determine, at least in part, the dimension d (e.g., distance between the surface 274 and the front of the handle 460).

Referring to the assembly 700, dashed lines indicate how a handle of a media drive assembly may open if positioned in one of the bays. As described herein, the assembly 700 may be part of the server unit 111 of FIG. 1. For example, a surface 728 of the assembly 700 may be a top surface where bases of the components 270-1, 270-2 and 270-3 may be attached to a lower surface plate. As shown in the example of FIG. 7, tabs may extend from the various components of the assembly 700 for attachment of components of a server unit (e.g., optical drives, computing components, etc.). A dotted line 701 indicates the position of a component of a server unit, which may optionally be mounted flush with handles of media drive assemblies seated in the bays (bay 1, bay 2, bay 3 and bay 4).

As described herein, keying achieved via rail and bay features can prevent improper insertion of a media drive assembly into a server system and also discourage use or modification of components from manufacturers that may be unlicensed, unauthorized, not certified, etc. As described herein, rails attach a media drive to a media drive tray or assembly and act as guides when inserting or removing a media drive with respect to a server unit. Keying of rails provides for insertion of a media drive assembly into a server unit in one orientation. As described herein, keying can prevent damage to media drive connectors (see, e.g., the connectors 536 of FIG. 5). As described herein, a bay of a server unit can include connectors that match a connector or connectors of a media drive. Through keying, connectors can be protected from damage. Other features described herein can also act to protect connectors or promote connector longevity and operation.

As described herein, an assembly configured for attachment to a media drive can include a base with a hinge end and a hinge axis and a handle with a hinge end, a locking tab and a swing end where the handle is configured for a locked orientation with respect to the base and configured for an unlocked orientation with respect to the base. In such an example, the locked orientation corresponds to a locked angle of rotation of the handle about the hinge axis where an end of the locking tab is rotated outwardly away from the hinge end of the base, the swing end of the handle is rotated inwardly toward the base and the hinge end of the base extends outwardly beyond the hinge end of the handle; whereas, the unlocked orientation corresponds to an unlocked angle of rotation of the handle about the hinge axis where an end of the locking tab is rotated inwardly toward the hinge end of the base, the swing end of the handle is rotated outwardly away from the base and the hinge end of the handle extends outwardly beyond the hinge end of the base (e.g., to contact a recessed surface of a bay component). As described herein, a base of an assembly can include an attachment mechanism configured to attach the base to a media drive tray.

In various examples, a handle is shown as having a substantially rectangular shape having a length and a height where a locking tab of the handle has a height less than approximately one-half the height of the handle. As described herein, a hinge end of a handle can include a biasing edge that has a height approximately equal to the height of the handle. However, in various examples, the entire length of a biasing edge may not contact a front facing surface of a bay component (see, e.g., FIG. 7). As described herein, a handle may include a biasing edge that has a length matched to length of a front facing surface of a bay component (e.g., consider a biasing edge matched to the surface 274 of the bay component 270).

As described herein, an assembly can include one or more processors configured to execute instructions stored in memory; memory configured to store processor-executable instructions; a media drive configured to store information and to respond to instructions executed by at least one of the one or more processors; a media drive bay with a recessed surface; a media drive tray subassembly configured to mount the media drive in the media drive bay where the subassembly includes a base and, attached to the base, a pivotal handle that includes a swing end and an opposing pivot end, the handle configured for a locked orientation with respect to the base where a locking tab extends from the pivot end and sits in a lock opening of the media drive bay and the handle configured for an unlocked orientation with respect to the base where the locking tab sits in a recess of the base and the pivot end contacts the recessed surface of the media drive bay.

As described herein, an assembly can include a processor that executes an operating system; a media drive tray that includes a first rail having a first rail height and a second rail having a second rail height that exceeds the first rail height; a media drive that is accessible by the processor and secured between the first rail and the second rail where the media drive includes a connector for power and a connector for communication of information; and a media drive bay that includes a first side slot configured for receipt of the first rail of the media drive tray and a second side slot configured for receipt of the second rail of the media drive tray to orient the connector for power and the connector for communication of the media drive secured by the media drive tray. In such an example, one of the rails can include a light guide (e.g., to transmit a status signal). As described herein, a media drive tray may include or be attached to a handle unit. As described herein, an assembly can include an air mover configured to draw air through one or more media drive bays.

As described herein, an assembly can include a processor or processing unit configured to execute instructions to initiate communication with a media drive via a connector for communication of information. As described herein, an assembly can include a processing unit (e.g., a processor) configured to execute instructions to initiate transmission of a status signal via a light guide of a rail of a media drive tray.

The term "circuit" or "circuitry" may be used herein (e.g., in the summary, description, and/or claims). As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions. Such circuitry may optionally rely on one or more computer-readable media that includes computer-executable instructions. As described herein, a computer-readable medium may be a storage device (e.g., a memory card, a storage disk, etc.) and referred to as a computer-readable storage medium.

Figure 8:
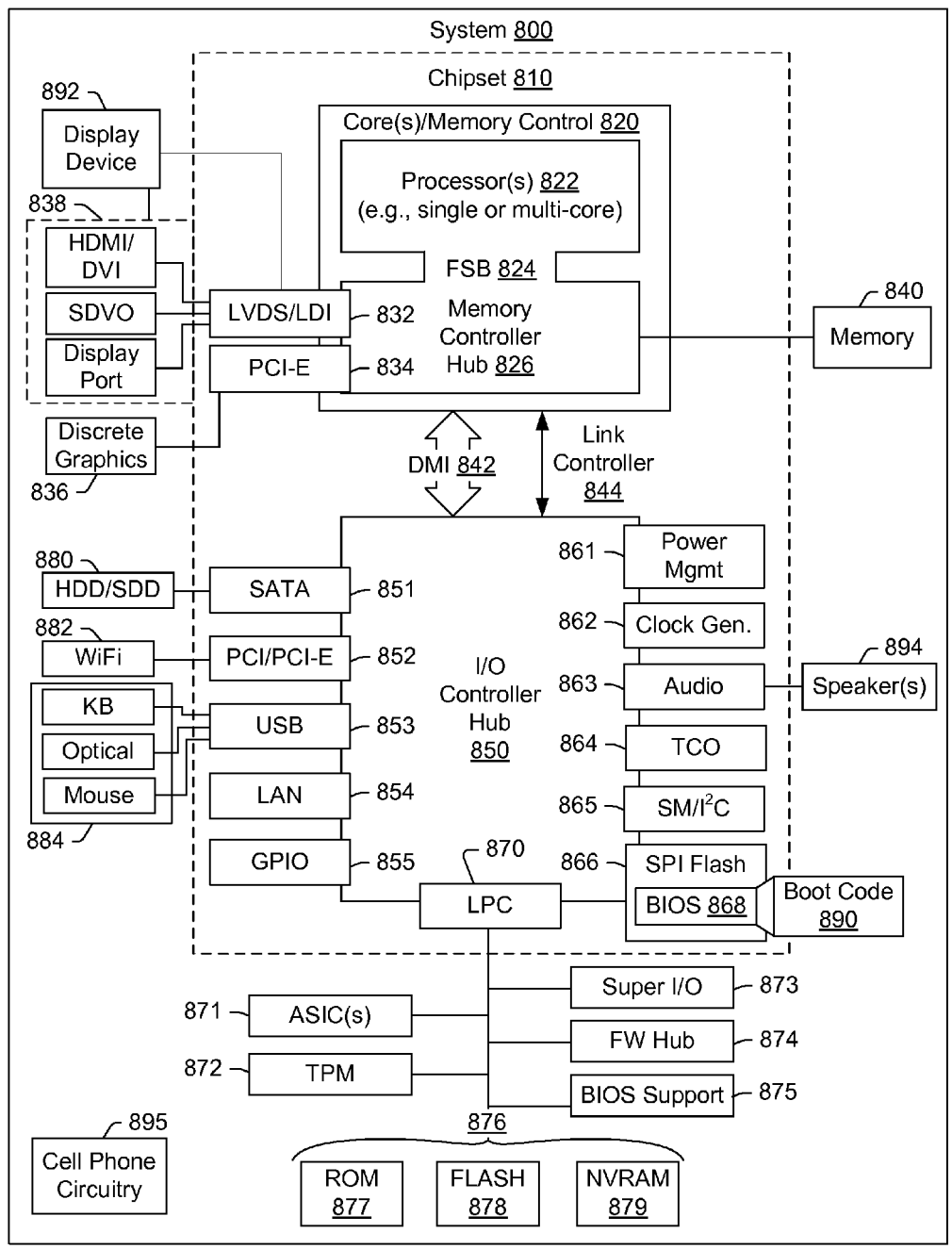
FIG. 8 is a diagram of an example of a machine.

While various examples of circuits or circuitry may be shown or discussed, FIG. 8 depicts a block diagram of an illustrative computer system 800. The system 800 may be a desktop computer system, such as one of the ThinkCentre® or ThinkPad® series of personal computers sold by Lenovo (US) Inc. of Morrisville, N.C., or a workstation computer, such as the ThinkStation® workstation computer sold by Lenovo (US) Inc. of Morrisville, N.C.; however, as apparent from the description herein, a satellite, a base, a server or other machine may include other features or only some of the features of the system 800 (e.g., consider the ThinkServer® server sold by Lenovo (US) Inc. of Morrisville, N.C.).

As shown in FIG. 8, the system 800 includes a so-called chipset 810. A chipset refers to a group of integrated circuits, or chips, that are designed to work together. Chipsets are usually marketed as a single product (e.g., consider chipsets marketed under the brands INTEL®, AMD®, etc.).

In the example of FIG. 8, the chipset 810 has a particular architecture, which may vary to some extent depending on brand or manufacturer. The architecture of the chipset 810 includes a core and memory control group 820 and an I/O controller hub 850 that exchange information (e.g., data, signals, commands, etc.) via, for example, a direct management interface or direct media interface (DMI) 842 or a link controller 844. In the example of FIG. 8, the DMI 842 is a chip-to-chip interface (sometimes referred to as being a link between a "northbridge" and a "southbridge").

The core and memory control group 820 include one or more processors 822 (e.g., single core or multi-core) and a memory controller hub 826 that exchange information via a front side bus (FSB) 824. As described herein, various components of the core and memory control group 820 may be integrated onto a single processor die, for example, to make a chip that supplants the conventional "northbridge" style architecture.

The memory controller hub 826 interfaces with memory 840. For example, the memory controller hub 826 may provide support for DDR SDRAM memory (e.g., DDR, DDR2, DDR3, etc.). In general, the memory 840 is a type of random-access memory (RAM). It is often referred to as "system memory".

The memory controller hub 826 further includes a low-voltage differential signaling interface (LVDS) 832. The LVDS 832 may be a so-called LVDS Display Interface (LDI) for support of a display device 892 (e.g., a CRT, a flat panel, a projector, etc.). A block 838 includes some examples of technologies that may be supported via the LVDS interface 832 (e.g., serial digital video, HDMI/DVI, display port). The memory controller hub 826 also includes one or more PCI-express interfaces (PCI-E) 834, for example, for support of discrete graphics 836. Discrete graphics using a PCI-E interface has become an alternative approach to an accelerated graphics port (AGP). For example, the memory controller hub 826 may include a 16-lane (×16) PCI-E port for an external PCI-E-based graphics card. A system may include AGP or PCI-E for support of graphics. As described herein, a display may be a sensor display (e.g., configured for receipt of input using a stylus, a finger, etc.). As described herein, a sensor display may rely on resistive sensing, optical sensing, or other type of sensing.

The I/O hub controller 850 includes a variety of interfaces. The example of FIG. 8 includes a SATA interface 851, one or more PCI-E interfaces 852 (optionally one or more legacy PCI interfaces), one or more USB interfaces 853, a LAN interface 854 (more generally a network interface), a general purpose I/O interface (GPIO) 855, a low-pin count (LPC) interface 870, a power management interface 861, a clock generator interface 862, an audio interface 863 (e.g., for speakers 894), a total cost of operation (TCO) interface 864, a system management bus interface (e.g., a multi-master serial computer bus interface) 865, and a serial peripheral flash memory/controller interface (SPI Flash) 866, which, in the example of FIG. 8, includes BIOS 868 and boot code 890. With respect to network connections, the I/O hub controller 850 may include integrated gigabit Ethernet controller lines multiplexed with a PCI-E interface port. Other network features may operate independent of a PCI-E interface.

The interfaces of the I/O hub controller 850 provide for communication with various devices, networks, etc. For example, the SATA interface 851 provides for reading, writing or reading and writing information on one or more drives 880 such as HDDs, SDDs or a combination thereof. The I/O hub controller 850 may also include an advanced host controller interface (AHCI) to support one or more drives 880. The PCI-E interface 852 allows for wireless connections 882 to devices, networks, etc. The USB interface 853 provides for input devices 884 such as keyboards (KB), one or more optical sensors, mice and various other devices (e.g., microphones, cameras, phones, storage, media players, etc.). On or more other types of sensors may optionally rely on the USB interface 853 or another interface (e.g., $I^2C$, etc.).

In the example of FIG. 8, the LPC interface 870 provides for use of one or more ASICs 871, a trusted platform module (TPM) 872, a super I/O 873, a firmware hub 874, BIOS support 875 as well as various types of memory 876 such as ROM 877, Flash 878, and non-volatile RAM (NVRAM) 879. With respect to the TPM 872, this module may be in the form of a chip that can be used to authenticate software and hardware devices. For example, a TPM may be capable of performing platform authentication and may be used to verify that a system seeking access is the expected system.

The system 800, upon power on, may be configured to execute boot code 890 for the BIOS 868, as stored within the SPI Flash 866, and thereafter processes data under the control of one or more operating systems and application software (e.g., stored in system memory 840). An operating system may be stored in any of a variety of locations and accessed, for example, according to instructions of the BIOS 868. Again, as described herein, a satellite, a base, a server or other machine may include fewer or more features than shown in the system 800 of FIG. 8. Further, the system 800 of FIG. 8 is shown as optionally including cell phone circuitry 895, which may include GSM, CDMA, etc., types of circuitry configured for coordinated operation with one or more of the other features of the system 800.

Conclusion

Although examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:

1. An assembly comprising:
a processor that executes an operating system;
a media drive tray that comprises a first rail having a first rail height and a second rail having a second rail height that exceeds the first rail height;
a media drive that is accessible by the processor and secured between the first rail and the second rail wherein the media drive comprises a connector for power and a connector for communication of information; and
a media drive bay that comprises a first side slot configured for receipt of the first rail of the media drive tray and a second side slot configured for receipt of the second rail of the media drive tray to orient the connector for power and the connector for communication of the media drive secured by the media drive tray.

2. The assembly of claim 1 wherein one of the rails comprises a light guide.

3. The assembly of claim 1 wherein the media drive tray comprises a handle unit.

4. The assembly of claim 1 further comprising an air mover configured to draw air through the media drive bay.

5. The assembly of claim 1 wherein the processor is configured to execute instructions to initiate communication with the media drive via the connector for communication of information.

6. The assembly of claim 1 wherein the processor is configured to execute instructions to initiate transmission of a status signal via the light guide.

7. The assembly of claim 1 wherein the media drive tray comprises a front plate, wherein the first rail extends from and is perpendicular to the front plate, wherein the second rail extends from and is perpendicular to the front plate, and wherein the second rail is parallel to the first rail.

8. The assembly of claim 7 wherein the front plate comprises air flow passages.

9. The assembly of claim 7 wherein an air flow gap exists between the media drive and the front panel.

10. The assembly of claim 2 wherein the second rail comprises the light guide.

11. The assembly of claim 7 wherein the front plate comprises attachment features for attaching the front plate to a handle unit.

12. The assembly of claim 1 wherein the first rail comprises a beveled end and wherein the second rail comprises a beveled end.

13. The assembly of claim 7 wherein the front plate comprises a height that exceeds the first rail height and the second rail height.

14. The assembly of claim 7 wherein the front plate, the first rail and the second rail comprise a U-shape.

15. The assembly of claim 1 wherein the first rail comprises a lower edge aligned with a lower edge of the second rail.

16. The assembly of claim 1 wherein the second side slot of the media bay comprises a clearance height that exceeds a clearance height of the first side slot of the media bay.

17. The assembly of claim 16 wherein the media bay comprises at least one protrusion that defines the clearance height of the second side slot and at least one protrusion that defines the clearance height of the first side slot.

18. The assembly of claim 3 wherein the handle unit comprises a locking tab located on a first rail side of the media drive tray.

19. The assembly of claim 3 wherein the media drive bay comprises a surface that protrudes inwardly, the surface being disposed at an axial location that is greater than the first rail height of the media drive tray.

20. The assembly of claim 3 wherein the second rail comprises a light guide and wherein the handle unit comprises a status indicator operatively coupled to the light guide.

* * * * *